(12) United States Patent
Jain

(10) Patent No.: US 6,310,810 B1
(45) Date of Patent: Oct. 30, 2001

(54) HIGH-SPEED SENSE AMPLIFIER

(76) Inventor: Raj Kumar Jain, 66 Bayshore Road, Unit 06-06, Diamond Tower (SG), 469985

( * ) Notice: Subject to any disclaimer, the term of this patent is extended or adjusted under 35 U.S.C. 154(b) by 0 days.

(21) Appl. No.: 09/615,986

(22) Filed: Jul. 14, 2000

(51) Int. Cl.$^7$ ....................................... G11C 7/00
(52) U.S. Cl. ........................................ 365/205; 365/210
(58) Field of Search .................................. 365/205, 210

(56) References Cited

U.S. PATENT DOCUMENTS 4,947,376 * 8/1990 Arimoto et al. ...................... 365/205

FOREIGN PATENT DOCUMENTS

0211195 * 9/1988 (JP) ............................... G11C/11/34

OTHER PUBLICATIONS

Betty Prince, "Semiconductor Memories", 1983, 2nd Edition, pp. 221–222.*

* cited by examiner

*Primary Examiner*—David Nelms
*Assistant Examiner*—M. Tran

(57) ABSTRACT

The invention pertains to a high-speed sense amplifier and to a method to operate the sense amplifier. The sense amplifier to which a power supply voltage can be applied via a semiconductor switch can be used to amplify a binary data signal read from a memory cell and it is arranged between two mutually complementary bit lines. The load output of the semiconductor switch can be precharged with a reference voltage source, wherein the amount of the reference voltage is less than or equal to the difference of the power supply voltage and the threshold voltage of the semiconductor switch. Due to this design, the read cycles can be clearly reduced. In addition, a greater read sensitivity is possible.

11 Claims, 2 Drawing Sheets

HIGH-SPEED SENSE AMPLIFIER

FIELD OF THE INVENTION

The invention pertains to a sense amplifier and to a method to operate the sense amplifier.

BACKGROUND OF THE INVENTION

Sense amplifiers are necessary for circuits that require the discrimination of signals into signals of different states, i.e., a defined logical state "1" or a logical state "0." For example, these sense amplifiers are used in all integrated memory circuits for recognition of the digital state of a memory cell. Sense amplifiers can be used to determine the difference in the form of stored charges, cell currents or cell voltages.

In the article by Travis N. Blalock et al.: "A High-Speed Clamped Bit-Line Current-Mode Sense Amplifier," IEEE Journal of Solid State Circuits, Vol. 28, No. 4, April 1991, p. 42ff, a related sense amplifier is described for a CMOS memory cell.

A sense amplifier of this kind compares an input signal, for example, the discharge capacitance of a memory cell, to a reference signal. The reference signal, whose value is between the two logical values, can be supplied by a so-called dummy memory cell, for example. The sense amplifier compares the two signals to each other. The line with the greater signal is released and a power supply voltage is applied to the signal to be amplified. If a logical "1" is to be allocated to the amplified data signal, then a positive power supply voltage is applied to the corresponding output line by means of a semiconductor circuit, for example. Conversely, a negative power supply voltage or a reference ground voltage is connected to the output line when the amplified data signal is to be a logical "0."

Integrated semiconductor switches of this kind, which can be designed as MOSFETs for example, have a a typical threshold voltage of 0.7 V. Due to this threshold voltage, the particular power supply voltage will be applied to the data signal to be amplified with a time-delay. This so-called switching latency time corresponds to the time needed to drive the particular MOS semiconductor switch until it actually switches. Physically, the switching latency time represents the time needed for a MOSFET to form a channel. The switching latency time $T_D$ moves within a range of several ns to several µs depending on the driving current of the gate electrode of the MOSFET.

The capability of today's semiconductor memories depends in particular on the speed that data can be read from or written into the memory. In particular, this performance of the memory is also determined by the capability of the corresponding sense amplifier.

SUMMARY OF THE INVENTION

Proceeding from this state of the art, therefore, it is the objective of the present invention to disclose a sense amplifier that will allow a faster read-out of data from the memory cells of semiconductor memories.

An additional objective of the invention is to disclose a method for operation of the sense amplifier according to the invention.

The invention provides that the loading path output of the semiconductor circuit in the off state is precharged to a voltage that is just below the threshold voltage of the semiconductor switch. With a trigger signal that is to switch on the semiconductor switch, this switching process occurs nearly with no switching latency time, since the working point of the semiconductor switch is just slightly below its threshold voltage. Due to the precharging of the loading path output of the semiconductor switch according to the invention, the performance of the sense amplifier and thus of the entire semiconductor memory can be greatly increased for one read process.

The precharging of the loading path output of the semiconductor switch is done by means of a voltage generator. This voltage generator can be designed, for example, by a MOS transistor whose loading path is connected to a suitable reference voltage. Due to a corresponding triggering of the gate terminal of the MOS transistor, it can be switched to the loading path output of the semiconductor switch as necessary.

By precharging the loading path output of the semiconductor switch, it is possible to reduce the duration of a read cycle significantly. Alternatively or additionally, the sense amplifier according to this invention can sense and differentiate clearly smaller differential data signals during one read process. Based on these factors, a very high performance of the semiconductor memory is possible during read out due to a a-significant reduction in access times on the order of about 30%. Furthermore, this method allows clearly reduced power consumption. Finally, due to the reduction in the period of a read cycle and a smaller power consumption, an optimum signal-to-noise ratio can be obtained.

In a preferred configuration of the invention, a bit line decoder is provided for a semiconductor memory that has two complementary sense amplifiers for every two mutually complementary bit lines, these amplifiers are arranged precisely in-between these bit lines and one of them is used to amplify a first logic data level "1" and the other can be used to amplify a second logic data level "0."

The sense amplifiers are each connected to the output of the bit lines via a transfer gate, and the outputs of these transfer gates are short-circuited to each other by means of a connecting line. This connecting line has a default voltage, typically the negative power supply voltage or the reference ground voltage. In particular, in very fast read processes, due to the parasitic capacities between the connecting line and the complementary bit lines, there will be undesirable noise.

As a solution, the invention provides a bit line decoder whose connecting line has a reference voltage, which typically corresponds to half the power supply voltage, applied to the output. By applying the reference voltage to the connecting line, the formation of parasitic capacitance between the connecting line and the bit lines can be mostly suppressed and thus the signal-to-noise ratio can be improved significantly.

BRIEF DESCRIPTION OF THE DRAWINGS

The invention will be explained in greater detail below based on the embodiments provided in the figures. Shown are.

In all figures, the same or functionally equivalent elements are provided with the same reference numbers, unless otherwise specified.

DETAILED DESCRIPTION OF THE INVENTION

Figure 1:
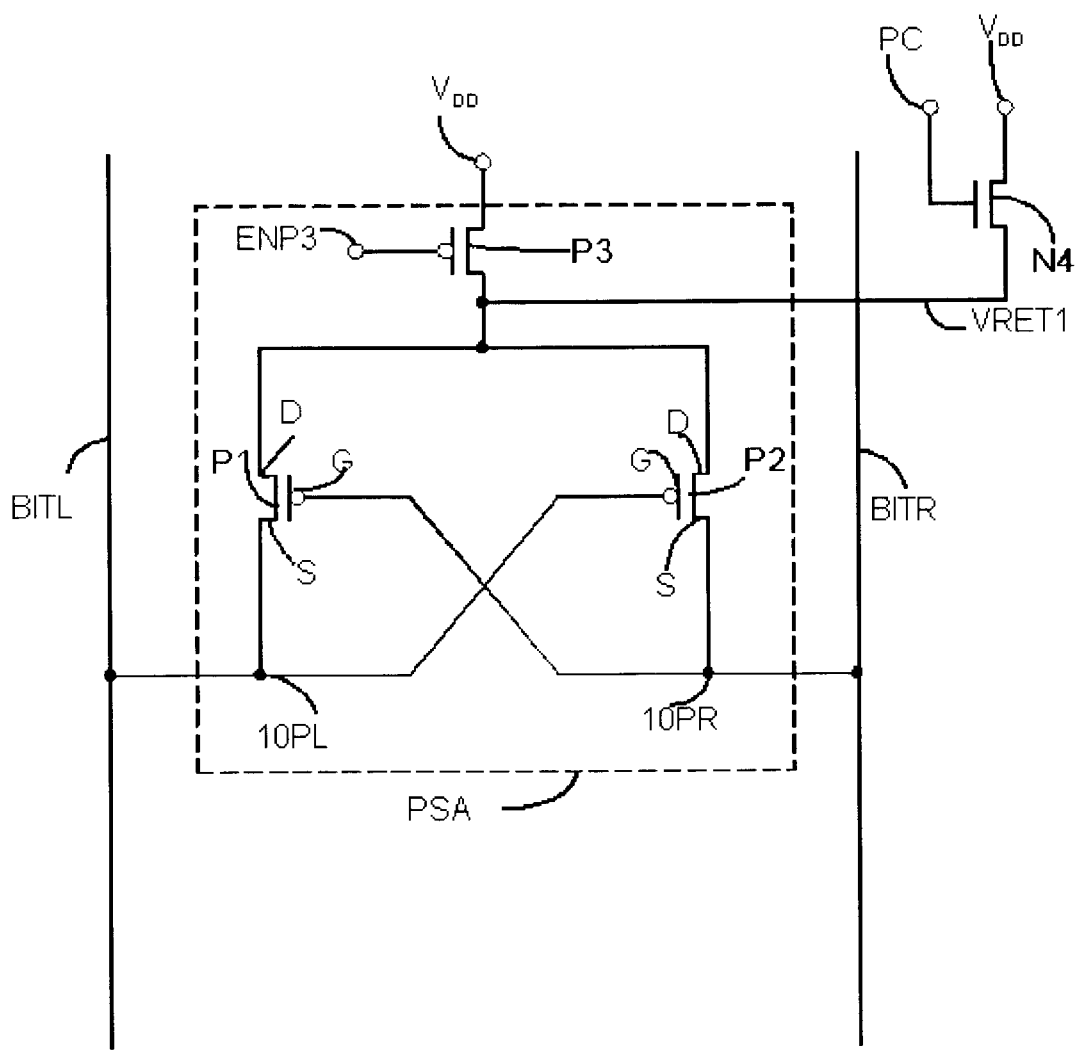
FIG. 1, a circuit diagram of the sense amplifier according to the invention to amplify a data signal.

FIG. 1 shows the circuit diagram of a sense amplifier PSA according to this invention. The sense amplifier PSA and its two input/outputs IOPL, IOPR are connected between two complementary bit lines BITL, BITR. The sense amplifier PSA has three p-channel MOSFETs P1, P2, P3. The source terminals of the p-channel transistors P1, P2 are connected to the outputs IOPL, IOPR respectively. In addition, the source terminals and gate terminals of the transistors P1, P2 are cross-connected to each other. The drain terminals of the transistors P1, P2 are short-circuited and connected over the loading path of the transistor P3 to a positive power supply voltage VDD. The control terminal of the transistor P3 can be driven by a control signal ENP3. The short-circuited drain terminals of the transistors P1, P2 and also the loading path output of the transistor P3 define a node P. A first reference voltage VREF1 can be applied to this node P by means of a controllable switch N4, which can be switched by the control signal PC. The first reference signal VREF1 is dimensioned so that its value corresponds essentially on the voltage on node P with the transistor P3 switched on. This means that the first reference voltage VREF1 must satisfy the following relation:

$$VREF1 \leq VDD-VTH,$$

where the symbol VTH denotes the threshold voltage of the transistor P3.

Figure 2:
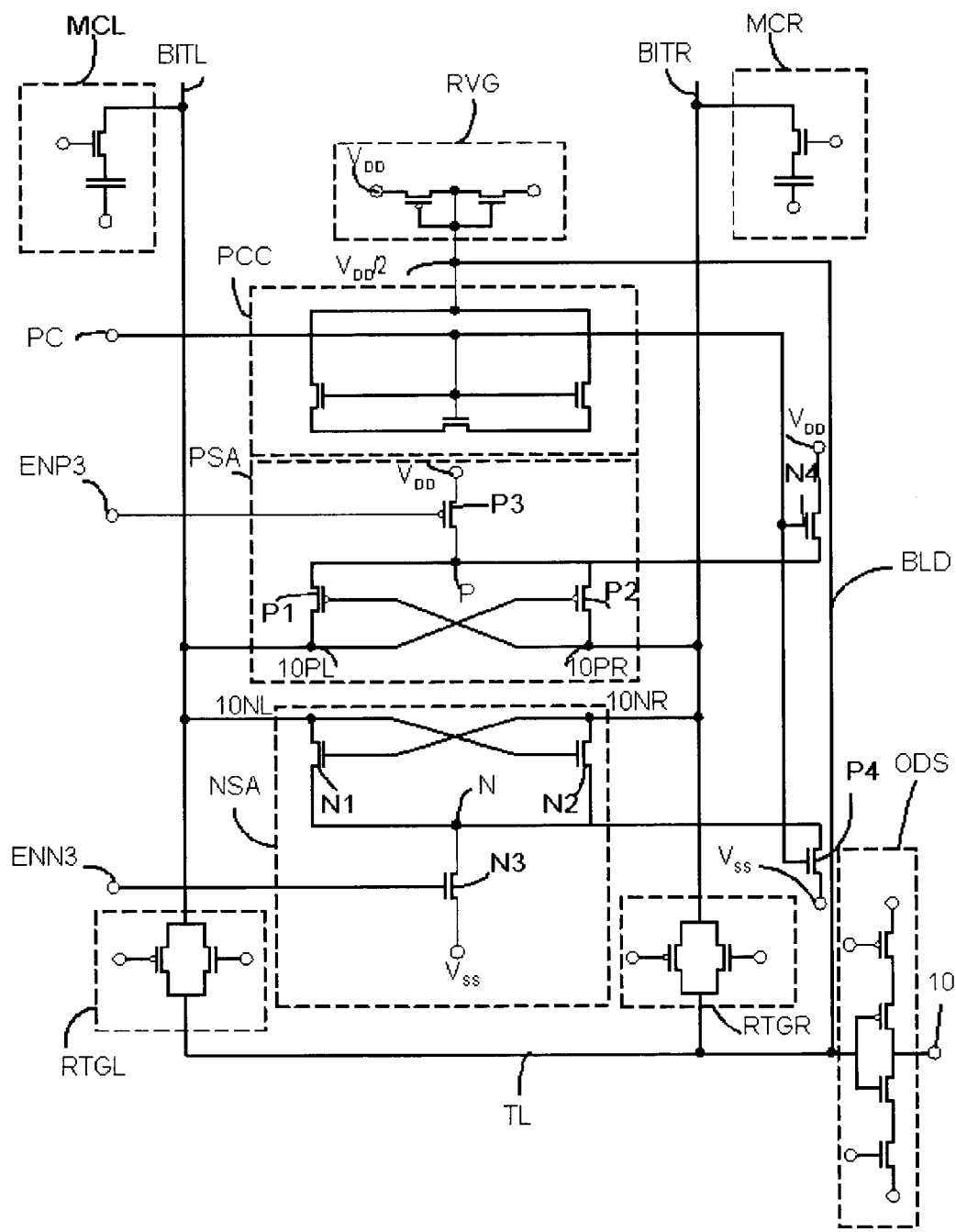
FIG. 2, a circuit diagram of a preferred configuration of a bit line decoder that has two sense amplifiers according to FIG. 1.

FIG. 2 shows the circuit diagram of a preferred configuration of a bit line decoder with two sense amplifiers according to FIG. 1.

FIG. 2 shows a section of a bit line decoder BLD, which is connected over two mutually complementary bit lines BITL, BITR to a corresponding memory cell MCL, MCR of a first column of a semiconductor memory. In the present embodiment, only two individual cells MCL, MCR of one column are shown. Of course, every semiconductor memory has a number of columns, which each contain multiple memory cells.

The bit line decoder BLD has two complementary sense amplifiers PSA, NSA. The two sense amplifiers PSA, NSA are each connected at their input/outputs IOPL, IOPR, IONL, IONR to the corresponding bit lines BITL, BITR. The first sense amplifier PSA is constructed in accordance with the sense amplifier in FIG. 1 and it is connected, as already known, via the transistor P3 to the positive power supply voltage VDD. The second sense amplifier NSA, which complements the first sense amplifier PSA, has three n-channel transistors N1, N2, N3. The control terminals and also the output terminals of the transistors N1, N2 are cross-connected to each other. The mutually cross-connected terminals of the transistors N1, N2 are connected to a negative power supply voltage VSS via the transistor N3. In the present embodiment, it is assumed that the negative power supply voltage VSS is at reference ground voltage (VSS=0 V). The transistor N3 can be driven by a control signal ENN3. The mutually cross-connected common terminals of the transistors N1, N2, N3 define a node N, which is connected via the loading path of a switching transistor P4 to the negative power supply voltage VSS.

A second reference voltage VREF2 can be applied to the node N by means of the controllable switch P4, which likewise can be switched on by the control signal PC. The value of the second reference voltage VREF2 should correspond essentially to the voltage on node N with transistor N3 switched on. Thus, the second reference voltage VREF2 should satisfy the following relation:

$$VREF2 \leq VTH-VSS=VTH.$$

Furthermore, a precharging circuit PCC is located between the bit lines BITL, BITR in the known manner. The precharging circuit PCC can be switched on and off via a precharging control signal PC, which is also used to switch on the switching transistors N4, P4. In addition, the precharging circuit PCC is connected to a reference voltage generator RVG. In the present embodiment, the reference voltage generator RVG of the known design, supplies a reference voltage VDD/2, which corresponds to exactly half the source voltage (VDD–VSS)/2. This reference voltage VDD/2 can be applied to the bit lines BITL, BITR via the precharging control signal PC.

A read transfer gate RTGL, RTGR is provided at the output of the bit line decoder BLD for each of the bit lines BITL, BITR. The outputs of the read transfer gates RTGL, RTGR are connected to each other over a connecting line TL and to an output driver circuit ODS. The output driver circuit ODS is formed here by a tristate gate circuit and is connected to the output IO of the bit line decoder BLD and thus to the output of the semiconductor memory. According to this invention, the reference voltage VDD/2 can also be applied to the connecting line TL via the output of the reference voltage generator RVG.

In the present embodiment, the precise configuration of the precharging circuit PCC, the memory cells MCL, MCR, the read transfer gate RTGL, RTGR and the output stage ODS is not presented in detail. At this place it should be noted that these circuit parts are constructed in the known manner and were illustrated solely for a better understanding of the bit line decoder in the circuit diagram in FIG. 2. Therefore, it is obvious that these circuit elements—which were illustrated only schematically in FIG. 2—can also be formed in some other manner.

The circuit elements of the bit line decoder BLD, in particular the circuit elements of the sense amplifiers PSA, NSA, are formed in the present embodiment by p-channel MOSFETs and n-channel MOSFETs. However, it is self-evident that these transistors can be formed using other engineering technology, e.g., bipolar transistors, depending on the requirements.

For reasons of better clarity, in the circuit diagram in FIG. 2, only the elements essential for an understanding of the invention are illustrated. The bit line decoder BLD according to FIG. 2 is suitable only for reading of data here. However, it is self-evident that by adding shift transfer gates which are connected to the corresponding bit lines BITL, BITR, the bit line decoder BLD could be expanded to also write data to the corresponding memory cells. In addition, it obviously requires no inventive activity for someone skilled in the art to configure or to refine the sense amplifier PSA, NSA according to the invention and also the bit line decoder BLD according to the invention into any other favorable circuit design.

The operation of the sense amplifier PSA, NSA will be explained in greater detail below with reference to the embodiments according to FIGS. 1–2.

It is assumed, in this case, that in one read process by the sense amplifier PSA, a positive power supply voltage VDD is superimposed on a logical data signal "1," while by means of the sense amplifier NSA, the negative power supply voltage or the voltage 0 V is supplied for a logical data signal "0."

A read process will be described below based on the example of the memory cell MCL. The memory cell MCR, which is complementary to this memory cell MCL, can be formed by a so-called dummy memory cell, for example. During reading of the memory cell MCL, this dummy memory cell produces a reference signal, whose value is typically exactly between the two logical data levels "1" and "0."

At the beginning of a read process, the two bit lines BITL, BITR are enabled. In this case, the precharging circuit PCC is switched on by the precharging control signal PC. The precharging circuit PCC applies half the power supply voltage VDD/2 to the two bit lines BITL, BITR.

At the same time, the switching transistors N4, P4 are switched on via the precharging control signal PC. By switching on the switching transistor N4, the first reference voltage VREF1 is applied to the node P of the first sense amplifier PSA. And similarly, the second reference voltage VREF2 is applied to the node N by switching on the switching transistor P4. The memory cell MCL is read out after precharging the bit lines BITL, BITR and also after applying the first and second reference voltage VREF1, VREF2 to the nodes N, P. In this case, the logical data signal "1" or "0" are superimposed on the bit line BITL with the corresponding logical data signal, i.e., depending on the stored data content of the memory cell MCL. The other bit line BITR is superimposed with the reference signal of the dummy memory cell MCR, which is exactly between the two logical data signals in the present embodiment. Thus, there is a slight difference in the signals on the two bit lines BITL, BITR. This difference in the signal levels of the bit lines BITL, BITR can be measured by the sense amplifier PSA, NSA. For example, if a logical "1" is read out from the memory cell MCL, then the transistor P1 switches the first sense amplifier [PSA] on, and for a logical data level "0," the transistor N1 switches the second sense amplifier NSA On. Immediately after reading out the memory cell MCL, the switching transistors P3, N3 are switched on via the control signals ENP3, ENN3. In this manner, depending on the sense amplifiers PSA, NSA that are switched on, the corresponding power supply voltage VDD, VSS is superimposed on the signal on the bit line BITL. By precharging the nodes P, N, the corresponding sense amplifiers PSA, NSA are switched on with nearly no switching latency time, i.e., nearly simultaneously with a signal change of the trigger signals ENP3, ENN3.

Due to this "latency-free" switching, very fast read cycles can be attained. Additionally or alternatively, it is quite possible to produce sense amplifiers which have a clearly smaller measuring sensitivity, i.e., they can distinguish a smaller difference in signals on the bit lines BITL, BITR. In this manner, memory cells can be produced whose capacitive elements and transistors can be of smaller dimensions. Semiconductor memories of this kind can thus be operated with a lower power supply voltage.

In one configuration of the invention, a reference voltage is also supplied to the connecting line TL, which connects the bit lines BITL, BITR to the output of the transfer gate RTGL, RTGR. In the present embodiment, this reference voltage is made available by the reference voltage VDD/2 provided by the output side by the reference voltage generator RVG. In this manner, parasitic capacitances, which can result in fast read processes with very strong EMC-radiation, can be minimized. Thus, in a favorable manner, the signal-to-noise ratio can be significantly improved.

While the invention has been particularly shown and described with reference to various embodiments, it will be recognized by those skilled in the art that modifications and changes may be made to the present invention without departing from the spirit and scope thereof. Merely by way of example, the invention can be useful for reducing the impact of coupling noise in any type of differential signal lines. The scope of the invention should therefore be determined not with reference to the above description but with reference to the appended claims along with their full scope of equivalents.

What is claimed is:

1. Sense amplifier (PSA, NSA) to amplify a binary data signal read from a memory cell (MCL, MCR) of a semiconductor memory, (a) which is arranged between two mutually complementary bit lines (BITL, BITR) that are each connected to a memory column of the semiconductor memory; (b) with a semiconductor switch (P3, N3) whose load output (P, N) is connected to the sense amplifier (PSA, NSA) and through which a power supply voltage (VDD, VSS) can be switched onto the sense amplifier (PSA, NSA); (c) with a reference voltage source (VDD, N4; VSS, P4) for a reference voltage (VREF1, VREF2) which can be switched onto the load output (P, N) of the semiconductor switch (P3, N3), wherein the amount of the reference voltage (VREF1, VREF2) is less than or equal to the difference of the power supply voltage (VDD, VSS) and the threshold voltage of the semiconductor switch (P3, N4).

2. Sense amplifier according to claim 1, in which the semiconductor switch (P3, N3) and/or the reference voltage source (VDD, N4; VSS, P4) each contain one MOS transistor.

3. Sense amplifier according to one of claims 1 or 2, which features two transistors (P1, P2; N1, N2), whose first loading path terminals are short-circuited and connected to the loading path output (P; N) of the semiconductor switch (P3; N3) and whose second loading path terminals and gate terminals are cross-circuited to each other.

4. Bit line decoder (BLD) (a) which is suitable at least to read binary data from the memory cells (MCL, MCR) of a semiconductor memory; (b) which is connected over multiple paired bit lines (BITL, BITR) to these memory cells (MCL, MCR) of the semiconductor memory; (c) which has at least one precharging circuit (PCC) with an output that provides a second reference voltage (VDD/2) which can be switched onto the bit lines (BITR, BITL); (d) which has two mutually complementary sense amplifiers (PSA, NSA) for each bit line pair (MCL, MCR) according to claims 1 or 3, which is each connected between these two bit lines (BITR, BITL); (e) wherein the first sense amplifier (NSA, PSA) is provided to amplify a first logical data level and the second sense amplifier (NSA, PSA) is provided to amplify the complementary second logical data level.

5. Bit line decoder according to claim 4, (f) with at least one read transfer gate (RTGL, RTGR) for each bit line (BITL, BITR), which connects the two complementary bit lines (BITL, BITR) to each other via at least one connecting line (TL) and to the output of the semiconductor memory; (g) wherein the second reference voltage (VDD/2) of the precharging circuit (PCC) can be switched onto the connecting line (TL).

6. Bit line decoder according to claim 5, (h) that has a single precharging circuit (PCC) for all sense amplifiers (PSA, NSA) of the bit line decoder.

7. Bit line decoder according to claim 5, in which the second reference voltage (VDD/2) corresponds to half the power supply voltage, where the amount of the power supply voltage is obtained from the difference of the two power supply voltages (VDD, VSS).

8. Bit line decoder according to claim 5, in which the second power supply voltage (VSS) is the voltage of the reference ground.

9. Method to operate a sense amplifier (PSA, NSA) according to claim 8, in which the load output (P, N) of the semiconductor switch (P3, N3) is precharged by a reference voltage (VREF1, VREF2) of the voltage generator (VDD, N4; VSS, P4) before the connection of the power supply voltage (VDD, VSS).

10. Method according to claim 9, in which the following processing steps are carried out for every read cycle:

at the beginning of a read cycle, the loading path output of the semiconductor switch (P3, N3) and thus the power supply voltage (VDD, VSS) is decoupled from the sense amplifier (PSA, NSA);

the bit lines (BITR, BITL) are each enabled via the second reference voltage (VDD/2) of the precharging circuit (PCC);

simultaneous with the enabling of the bit lines (BITR, BITL), the reference voltage (VREF1, VREF2) is apply to the load output (P, N) of the semiconductor circuit (P3, N3);

the semiconductor switch (P3, N3) switches so that the power supply voltage (VSS, VDD) is switched on to the sense amplifier (PSA, NSA);

after switching in the power supply voltage (VDD, VSS), the reference voltage (VREF1, VREF2) is again decoupled from the sense amplifier (PSA, NSA).

11. Method to operate a bit line decoder (BLD) according to claim 5, in which during the application of the second reference voltage (VDD/2) to the bit line pair (BITL, BITR), the second reference voltage (VDD/2) is also applied to the connecting line (TL).

* * * * *